(12) United States Patent
Li et al.

(10) Patent No.: US 11,114,630 B2
(45) Date of Patent: Sep. 7, 2021

(54) DISPLAY PANEL, MANUFACTURING METHOD THEREOF, DISPLAY DEVICE

(71) Applicant: BOE Technology Group Co., Ltd., Beijing (CN)

(72) Inventors: Shipei Li, Beijing (CN); Qi Yao, Beijing (CN); Wusheng Li, Beijing (CN); Jiangnan Lu, Beijing (CN); Huili Wu, Beijing (CN); Fang He, Beijing (CN); Renquan Gu, Beijing (CN); Dongsheng Yin, Beijing (CN); Sheng Xu, Beijing (CN); Wei He, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 84 days.

(21) Appl. No.: 16/597,905

(22) Filed: Oct. 10, 2019

(65) Prior Publication Data
US 2020/0235321 A1 Jul. 23, 2020

(30) Foreign Application Priority Data

Jan. 22, 2019 (CN) .......................... 201910059282.5

(51) Int. Cl.
*H01L 51/00* (2006.01)
*H01L 27/32* (2006.01)
*H01L 51/56* (2006.01)
*H01L 51/52* (2006.01)

(52) U.S. Cl.
CPC ...... *H01L 51/0097* (2013.01); *H01L 27/3246* (2013.01); *H01L 27/3258* (2013.01); *H01L 27/3272* (2013.01); *H01L 51/003* (2013.01); *H01L 51/5253* (2013.01); *H01L 51/56* (2013.01); *H01L 2227/326* (2013.01); *H01L 2251/5338* (2013.01)

(58) Field of Classification Search
CPC ............. H01L 51/0097; H01L 51/5253; H01L 51/0003; H01L 2225/5338; H01L 2227/326; Y02E 10/549
See application file for complete search history.

(56) References Cited

U.S. PATENT DOCUMENTS

| | | | |
|---|---|---|---|
| 2013/0089954 A1* | 4/2013 | Ro | ...................... H01L 27/1266 438/113 |
| 2019/0173029 A1* | 6/2019 | Jin | ...................... H01L 51/0097 |
| 2020/0203611 A1* | 6/2020 | Peng | ................... H01L 51/0017 |

* cited by examiner

*Primary Examiner* — Caridad Everhart
(74) *Attorney, Agent, or Firm* — Myers Bigel, P.A.

(57) ABSTRACT

A display panel is provided, including a substrate on a base, a transistor stack on the substrate, and a fluorescent layer between the base and the transistor stack. The fluorescent layer is configured to prevent light from damaging an active layer in the transistor stack in a laser lift-off process, and an orthographic projection of the fluorescent layer on the base overlaps an orthographic projection of the active layer on the base. A display device comprising the display panel, and a manufacturing method of the display panel are further provided.

18 Claims, 4 Drawing Sheets

DISPLAY PANEL, MANUFACTURING METHOD THEREOF, DISPLAY DEVICE

RELATED APPLICATION

The present application claims the benefit of Chinese Patent Application No. 201910059282.5, filed on Jan. 22, 2019, the entire disclosure of which is incorporated herein by reference.

FIELD

The present disclosure relates to the field of display technologies, and specifically to a display panel, a manufacturing method thereof, and a display device.

BACKGROUND

Organic light emitting diode displays are characterized by self-illumination, wide viewing angle, low power consumption, high contrast, and the like, and are therefore one of the mainstream display types. Compared to liquid crystal displays, which cannot achieve flexible bending due to their structural limitations, organic light emitting diode displays can realize flexible display by fabricating respective layers with flexible materials, thereby expanding the display application field and improving the user experience.

A typical organic light emitting diode display comprises an array substrate and an organic light emitting element on the array substrate, wherein the array substrate comprises an array of transistors that provides a driving signal to the organic light emitting element. In order to prevent light emitted by the organic light emitting element from being incident on the active layer of the transistor and thereby affecting normal operation of the transistor, the gate of the transistor may be arranged on the top of the transistor (i.e., forming a top gate type transistor), so that the gate can simultaneously act as a light shielding layer to protect the underlying active layer.

However, when a flexible organic light emitting diode display is being fabricated, it is necessary to lift off a fabricated flexible device from a rigid substrate using a laser. The laser will be adversely incident on the active layer of the transistor from below, thereby affecting the performance of the transistor. It has been proposed to arrange a metal light shielding layer under the active layer of the transistor to shield ultraviolet light used in a laser lift-off process. However, the metal light shielding layer will still cause a part of the light to be obliquely incident into the active layer after being reflected multiple times, so that damage to the active layer cannot be completely avoided.

SUMMARY

An aspect of the present disclosure provides a display panel comprising: a substrate on a base; a transistor stack on the substrate; and a fluorescent layer between the base and the transistor stack. The fluorescent layer is configured to prevent light from damaging an active layer in the transistor stack in a laser lift-off process, and an orthographic projection of the fluorescent layer on the base covers an orthographic projection of the active layer on the base.

According to some exemplary embodiments of the present disclosure, the base is a rigid base and the substrate is a flexible substrate.

According to some exemplary embodiments of the present disclosure, the orthographic projection of the fluorescent layer on the base completely overlaps the orthographic projection of the active layer on the base.

According to some exemplary embodiments of the present disclosure, the orthographic projection of the fluorescent layer on the base completely overlaps an orthographic projection of the substrate on the base.

According to some exemplary embodiments of the present disclosure, the fluorescent layer comprises a photoresist mixed with at least one of an organic fluorescent material and an inorganic fluorescent material.

According to some exemplary embodiments of the present disclosure, the organic fluorescent material comprises at least one of fluorescein, rhodamine, a cyanine dye and a pyrene dye, and the inorganic fluorescent material comprises at least one of an alkali metal sulfide and an aluminate.

According to some exemplary embodiments of the present disclosure, the transistor stack comprises the active layer, a gate insulating layer on the active layer, a gate on the gate insulating layer, an interlayer insulating layer on the gate, and a source and a drain on the interlayer insulating layer and in contact with the active layer through a via hole in the interlayer insulating layer.

According to some exemplary embodiments of the present disclosure, the above display panel further comprises a passivation layer on the transistor stack, a planarization layer on the passivation layer, an electrode layer on the planarization layer and in contact with the transistor stack through via holes in the passivation layer and the planarization layer, a pixel defining layer on the electrode layer, a light emitting layer on the pixel defining layer, and a thin film encapsulation layer on the light emitting layer.

According to some exemplary embodiments of the present disclosure, the above display panel further comprises a support layer between the pixel defining layer and the light emitting layer.

According to some exemplary embodiments of the present disclosure, the above display panel further comprises a buffer layer between the fluorescent layer and the active layer.

Another aspect of the present disclosure provides a display device comprising any of the display panels described above.

According to some exemplary embodiments of the present disclosure, the base is removed from the substrate.

A further aspect of the present disclosure provides a manufacturing method of a display panel, comprising: providing a substrate on a base; providing a fluorescent layer on the substrate, the fluorescent layer being configured to prevent light from damaging an active layer in a transistor stack in a laser lift-off process; providing the transistor stack on the fluorescent layer, wherein an orthographic projection of the fluorescent layer on the base covers an orthographic projection of the active layer on the base; and lifting off the base from the substrate by the laser lift-off process.

According to some exemplary embodiments of the present disclosure, said providing a fluorescent layer on the substrate comprises: coating a fluorescent material layer on the substrate; and patterning the fluorescent material layer to form the fluorescent layer such that the orthographic projection of the fluorescent layer on the base completely overlaps the orthographic projection of the active layer on the base.

According to some exemplary embodiments of the present disclosure, said coating a fluorescent material layer on the substrate comprises: mixing one or more of an organic fluorescent material and an inorganic fluorescent material in a photoresist to form a fluorescent material; and coating the fluorescent material on the substrate to form the fluorescent material layer.

According to some exemplary embodiments of the present disclosure, the above manufacturing method further comprises providing a buffer layer on the fluorescent layer prior to providing the transistor stack.

According to some exemplary embodiments of the present disclosure, said providing a transistor stack on the fluorescent layer comprises: forming the active layer, a gate insulating layer, a gate, an interlayer insulating layer, and a source and a drain on the fluorescent layer successively. The source and the drain are in contact with the active layer through a via hole in the interlayer insulating layer.

According to some exemplary embodiments of the present disclosure, the above manufacturing method further comprises: forming a passivation layer, a planarization layer, an electrode layer, a pixel defining layer, a light emitting layer, and an encapsulation layer on the transistor stack successively. The electrode layer is in contact with the source and the drain through a via hole in the passivation layer and the planarization layer.

According to some exemplary embodiments of the present disclosure, the above manufacturing method further comprises: forming a support layer between the pixel defining layer and the light emitting layer.

According to some exemplary embodiments of the present disclosure, the base is made of a rigid material, and the substrate is made of a flexible material.

The above description is only an overview of the technical solutions of embodiments of the present disclosure. In order to enable the technical measures of the embodiments of the present disclosure to be clearly understood and implemented according to the contents of the specification, and to make the above and other purposes, features and advantages of the embodiments of the present disclosure clear and readily understood, implementations of the embodiments of the present disclosure are illustrated below.

BRIEF DESCRIPTION OF THE DRAWINGS

Various other advantages and benefits will become apparent to those ordinarily skilled in the art through reading the following detailed description of exemplary embodiments. The drawings are only for the purpose of illustrating the exemplary embodiments, and are not to be construed as limiting embodiments of the present disclosure. In the drawings, the same reference numerals are used to denote the same components. In the drawings.

DETAILED DESCRIPTION

Figure 1:
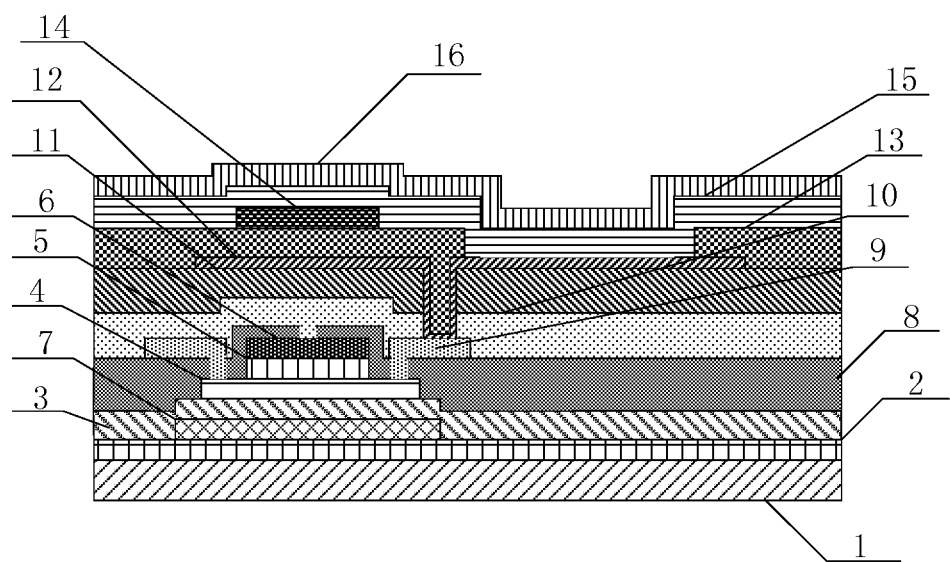
FIG. 1 is a schematic structural view of a display panel according to an embodiment of the present disclosure.

Exemplary embodiments of the present disclosure will be described in more detail below with reference to the accompanying drawings. While the exemplary embodiments of the present disclosure have been illustrated in the drawings, it is to be understood that the present disclosure can be implemented in various forms and should not be limited by the embodiments illustrated herein. On the contrary, these embodiments are provided to enable the present disclosure to be understood thoroughly, and to completely convey the scope of the present disclosure to those skilled in the art.

FIG. 1 shows a schematic structural view of a display panel according to an embodiment of the present disclosure. As shown in FIG. 1, an embodiment of the present disclosure provides a display panel comprising a substrate 2 on a base 1, a transistor stack on the substrate 2, and a fluorescent layer 7 between the base 1 and the transistor stack. The fluorescent layer 7 is configured to prevent light from damaging an active layer 4 in the transistor stack in a laser lift-off process, and an orthographic projection of the fluorescent layer 7 on the base 1 covers an orthographic projection of the active layer 4 on the base 1.

In an embodiment of the present disclosure, a fluorescent layer is used in place of the conventionally used metal light shielding layer. The fluorescent layer can typically absorb high-energy light generated in the laser lift-off process and convert it into low-energy light that has no effect on the active layer 4, thereby ensuring that the active layer 4 is not adversely affected when the substrate 2 is lifted off from the base 1 using a laser.

In an embodiment of the present disclosure, the base 1 may be a rigid base, for example, a glass base, etc., which is nearly inflexible and serves to provide support for the superstructure during fabrication of the superstructure. The superstructure including the substrate 2 and its upper structures may have flexibility as a whole, that is, it may be bent to some extent without affecting the normal display function. In this case, a flexible organic light emitting diode display panel can be made.

Optionally, in an embodiment, the orthographic projection of the fluorescent layer 7 on the base 1 completely overlaps the orthographic projection of the active layer 4 on the base 1 in order to provide protection for the active layer 4 on the one hand, and avoid unnecessary waste of the fluorescent layer 7 on the other hand. Moreover, since the fluorescent layer 7 is generally less flexible than a flexible organic functional material for making the flexible display panel, the arrangement of the fluorescent layer 7 having a smaller area can improve the bending performance of the flexible display panel.

Alternatively, in another embodiment, the orthographic projection of the fluorescent layer 7 on the base 1 completely overlaps an orthographic projection of the substrate 2 on the base 1 in order to provide more sufficient protection for the active layer 4.

In an exemplary embodiment, the fluorescent layer 7 comprises a photoresist mixed with an organic fluorescent material, or a photoresist mixed with an inorganic fluorescent material. However, other suitable materials may also be employed by those skilled in the art in light of the teachings of the present disclosure.

By way of example, the organic fluorescent material comprises at least one of fluorescein, rhodamine, a cyanine dye and a pyrene dye. The inorganic fluorescent material comprises at least one of an alkali metal sulfide and an aluminate.

In an exemplary embodiment, as shown in FIG. 1, the transistor stack further comprises a gate insulating layer 5 on the active layer 4, a gate 6 on the gate insulating layer 5, an interlayer insulating layer 8 on the gate 6, and a source and a drain 9 on the interlayer insulating layer 8 and in contact with the active layer 4 through a via hole in the interlayer insulating layer 8.

Further, in an exemplary embodiment, the display panel further comprises a passivation layer 10 on the transistor stack, a planarization layer 11 on the passivation layer 10, an electrode layer 12 on the planarization layer 11 and in contact with the source and the drain 9 through via holes in the passivation layer 10 and the planarization layer 11, a pixel defining layer 13 on the electrode layer 12, a light emitting layer 15 on the pixel defining layer 13, and a thin film encapsulation layer 16 on the light emitting layer 15. Alternatively, the display panel may further comprise a support layer 14 between the pixel defining layer 13 and the light emitting layer 15.

In an exemplary embodiment, as shown in FIG. 1, the display panel further comprises a buffer layer 3 between the fluorescent layer 7 and the active layer 4. The buffer layer 3 can prevent various particles in the fluorescent layer 7 from entering the active layer 4 and thereby affecting the performance of the active layer 4, ensuring normal operation of the transistor.

Instead of using a metal light shielding layer to shield high-energy ultraviolet light generated in the laser lift-off process, in embodiments of the present disclosure, the fluorescent layer is utilized to absorb high-energy ultraviolet light and convert it into lower-energy light. The low-energy light almost has no effect on the active layer of the transistor. Therefore, compared to the scheme in which the metal light shielding layer may cause ultraviolet light to be obliquely incident into the active layer so that a desired light shielding effect cannot be achieved, embodiments provided by the present disclosure can achieve a more desirable effect of shielding harmful light.

On the other hand, the metal light shielding layer may form a parasitic capacitance with other metal layers in the display panel, thereby affecting the performance of the display panel. In contrast, in embodiments of the present disclosure, the fluorescent layer and the metal layers in the display panel do not form a parasitic capacitance, and thus the influence of the parasitic capacitance on the characteristics of the display panel can be eliminated. In addition, in the case of a flexible display panel, the fluorescent layer can achieve a better flexible bending effect than the metal light shielding layer, and thus is more advantageous for the realization of a flexible organic light emitting diode display panel.

An embodiment of the present disclosure provides a display device comprising any of the display panels described above. In such a display device, instead of using a metal light shielding layer to shield high-energy ultraviolet light generated in the laser lift-off process, a fluorescent layer is utilized to absorb high-energy ultraviolet light and convert it into lower-energy light. The low-energy light almost has no effect on the active layer of the transistor. Therefore, compared to the scheme in which the metal light shielding layer may cause ultraviolet light to be obliquely incident into the active layer so that a desired light shielding effect cannot be achieved, embodiments provided by the present disclosure can achieve a more desirable light shielding effect.

Figure 2:
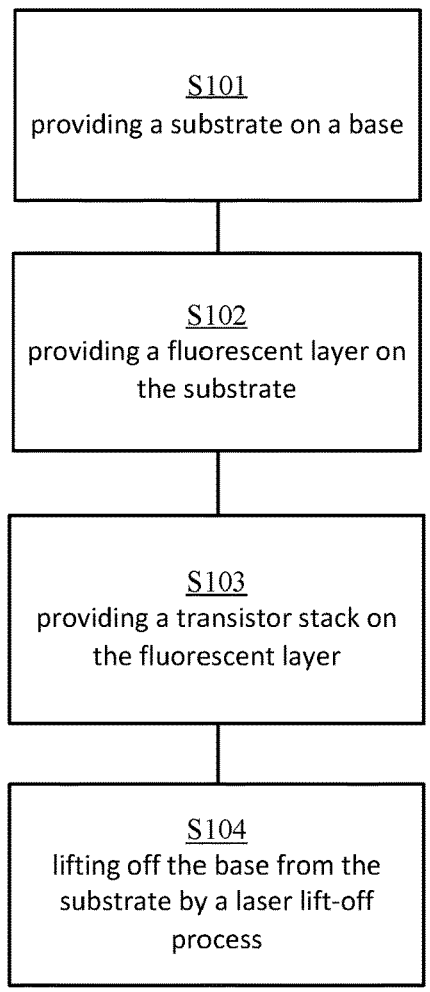
FIG. 2 is a flow chart of a method of manufacturing a display panel according to an embodiment of the present disclosure.

An embodiment of the present disclosure further provides a manufacturing method of a display panel. As shown in FIG. 2, the manufacturing method of the display panel comprises: at step S101, providing a substrate on a base; at step S102, providing a fluorescent layer on the substrate; at step S103, providing a transistor stack on the fluorescent layer, wherein an orthographic projection of the fluorescent layer on the base covers an orthographic projection of the active layer in the transistor stack on the base; and at step S104, lifting off the base from the substrate by a laser lift-off process.

The steps of the manufacturing method of the display panel according to an embodiment of the present disclosure will be described in detail below with reference to FIG. 1 and FIG. 3 to FIG. 11.

Figure 3:
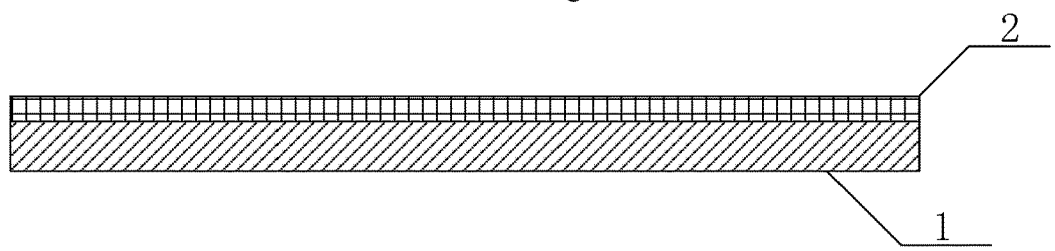
FIG. 3 is a schematic structural view illustrating fabrication of a substrate on a base according to an embodiment of the present disclosure.

At step S101, as shown in FIG. 3, a substrate 2 is provided on a base 1. Specifically, the base 1 may be a rigid base such as a glass base, and the substrate 2 may be a flexible substrate such as a polyimide film. In this case, the flexible substrate 2 can be provided on the rigid base 1 by coating.

Figure 4:
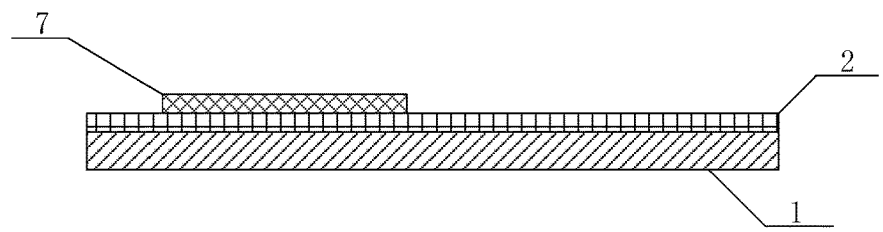
FIG. 4 is a schematic structural view illustrating fabrication of a fluorescent layer on the substrate of FIG. 3 according to an embodiment of the present disclosure.

At step S102, as shown in FIG. 4, a fluorescent layer 7 is provided on the substrate 2. Specifically, a fluorescent material may be coated on the substrate 2, and then the fluorescent material may be patterned to form the fluorescent layer 7. The orthographic projection of the patterned fluorescent layer 7 on the base 1 may completely overlap the orthographic projection of the active layer formed later on the base 1 in order to provide protection for the active layer on the one hand and to avoid unnecessary waste of the fluorescent layer 7 on the other hand. Moreover, since the fluorescent layer 7 is generally less flexible than a flexible organic functional material for making the flexible display panel, the arrangement of the fluorescent layer 7 having a smaller area can improve the bending performance of the flexible display panel.

Alternatively, the fluorescent material may not be patterned, in which case the formed fluorescent layer 7 covers the entire substrate 2 to provide more sufficient protection for the active layer formed later.

In an exemplary embodiment, coating the fluorescent material on the substrate comprises mixing at least one of an organic fluorescent material and an inorganic fluorescent material in a photoresist at a certain ratio to form the fluorescent material, and coating the fluorescent material on the substrate.

Figure 5:
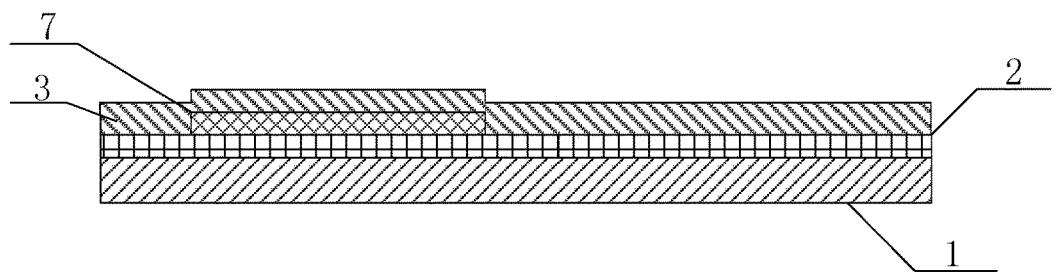
FIG. 5 is a schematic structural view illustrating fabricating a buffer layer on the substrate of FIG. 4 according to an embodiment of the present disclosure.

Optionally, as shown in FIG. 5, the above method further comprises providing a buffer layer 3 on the fluorescent layer 7 prior to providing the transistor stack. The buffer layer 3 may be a single layer medium such as silicon oxide (SiOx), silicon nitride (SiNx), silicon oxynitride (SiON) or the like, or a composite film layer. The buffer layer 3 can prevent various particles in the fluorescent layer 7 from entering the active layer formed later, ensuring the characteristics of the display panel.

Then, at step S103, a transistor stack is provided on the fluorescent layer 7. In an exemplary embodiment, the transistor stack includes an active layer 4, a gate insulating layer 5 on the active layer 4, a gate 6 on the gate insulating layer 5, an interlayer insulating layer 8 on the gate 6, and a source and a drain 9 on the interlayer insulating layer 8 and in contact with the active layer 4 through a via hole in the interlayer insulating layer 8. Accordingly, step S103 may include sub-steps as shown in FIGS. 6-8.

Figure 6:
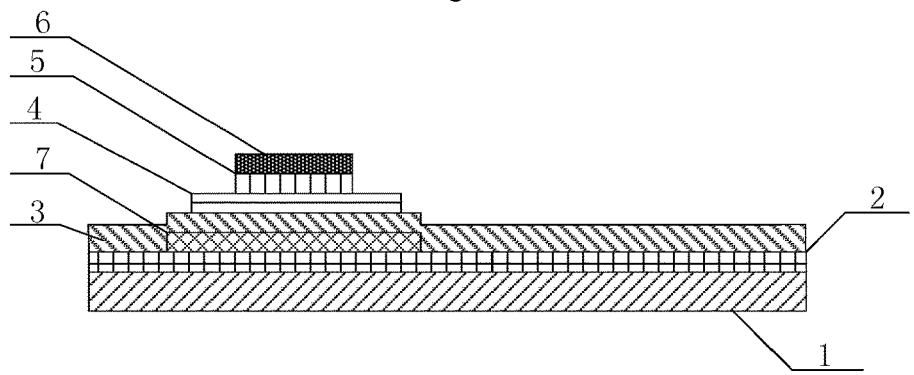
FIG. 6 is a schematic structural view illustrating fabrication of an active layer, a gate insulating layer, and a gate on the substrate of FIG. 5 according to an embodiment of the present disclosure.

As shown in FIG. 6, the active layer 4 is formed on the buffer layer 3 by a patterning process. The patterning process includes a part or all of the processes of coating, exposing, developing, etching, and removing the photoresist. The active layer formed in embodiments of the present disclosure may be an oxide semiconductor active layer including, but not limited to, a semiconductor material such as indium gallium zinc oxide (IGZO), indium zinc oxide (IZO), etc.

Next, as shown in FIG. 6, the gate insulating layer 5 and the gate 6 are sequentially formed on the active layer 4 by a patterning process. In an exemplary embodiment, the gate insulating layer 5 and the gate 6 may be formed by performing a photolithography process once. Specifically, after depositing a gate insulating material layer and a gate material layer sequentially, a photolithography process is performed on the gate insulating material layer and the gate material layer, then the gate 6 is formed by wet etching, and the gate insulating layer 5 is formed by dry etching. The gate insulating layer 5 may include one or more of silicon nitride and silicon oxide, and may be a single layer or a multilayer structure. Thereafter, exposed portions of the active layer 4 need to be specially treated so that portions thereof connected to the source and the drain 9 formed later become conductive to reduce the contact resistance.

Figure 7:
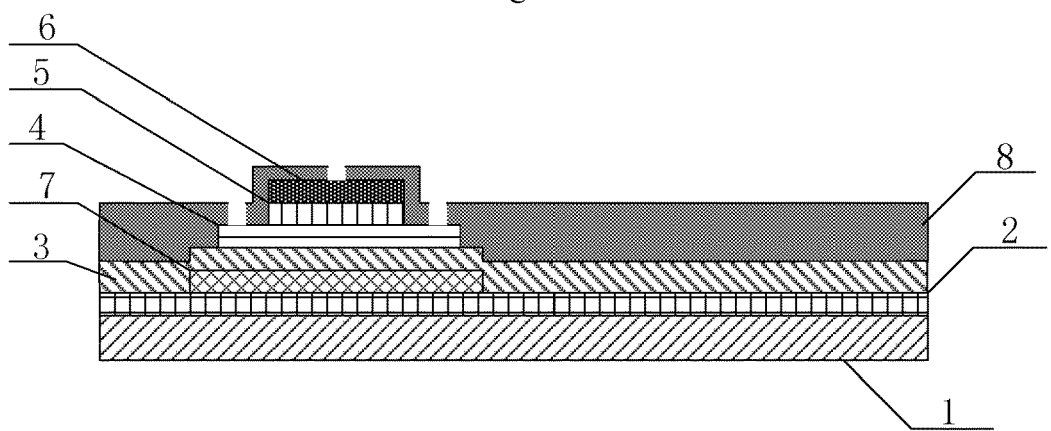
FIG. 7 is a schematic structural view illustrating fabrication of an interlayer insulating layer on the substrate of FIG. 6 according to an embodiment of the present disclosure.
Figure 8:
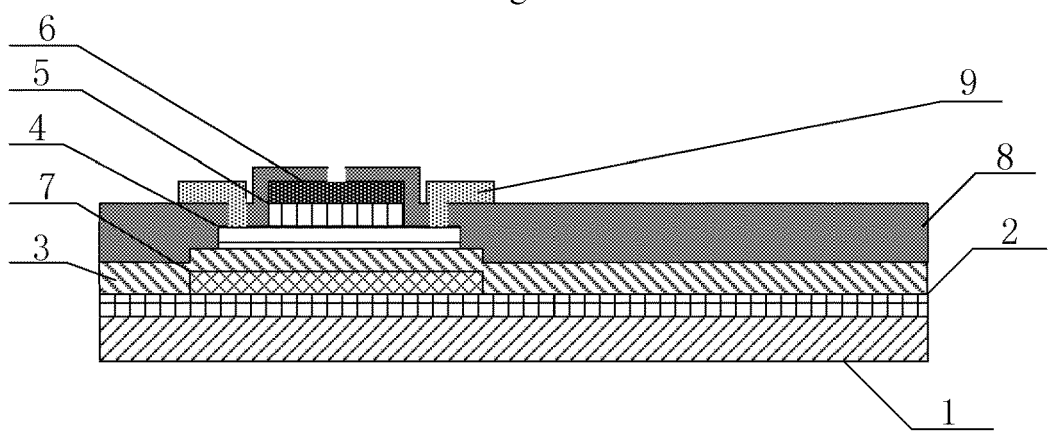
FIG. 8 is a schematic structural view illustrating fabrication of a source and a drain on the substrate of FIG. 7 according to an embodiment of the present disclosure.

Next, as shown in FIG. 7, the interlayer insulating layer 8 is formed on the gate 6 by a patterning process. The interlayer insulating layer 8 may include one or more of silicon nitride and silicon oxide, and may be a single layer or a multilayer structure. The interlayer insulating layer 8 has a via hole exposing a conductive portion of the active layer 4 so that the source and the drain 9 formed later are connected to the active layer 4 through the via hole.

Next, as shown in FIG. 8, the source and the drain 9 are formed on the interlayer insulating layer 8 by a patterning process. The source and the drain layer 9 may be made of a low-resistance metal, for example, made of copper (Cu).

In an exemplary embodiment, the display panel further comprises, as shown in FIG. 1, a passivation layer 10 on the transistor stack, a planarization layer 11 on the passivation layer 10, an electrode layer 12 on the planarization layer 11 and in contact with the source and the drain 9 through via holes in the passivation layer 10 and the planarization layer 11, a pixel defining layer 13 on the electrode layer 12, a support layer 14 on the pixel defining layer 13, a light emitting layer 15 on the support layer 14, and a thin film encapsulation layer 16 on the light emitting layer 15. Accordingly, the above method may also comprise additional steps as shown in FIGS. 9-11.

Figure 9:
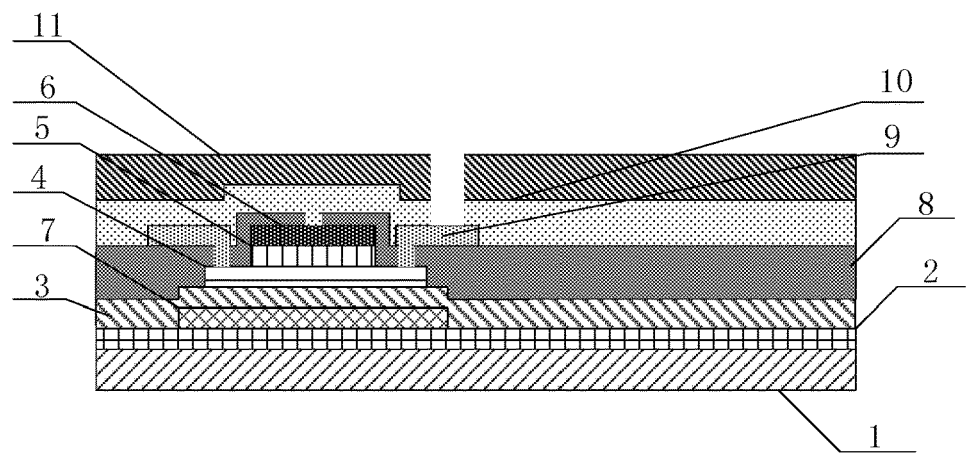
FIG. 9 is a schematic structural view illustrating fabrication of a passivation layer and a planarization layer on the substrate of FIG. 8 according to an embodiment of the present disclosure.

Specifically, as shown in FIG. 9, the passivation layer 10 and the planarization layer 11 are sequentially formed on the transistor stack by a patterning process. The passivation layer 10 may be made of silicon oxide and/or silicon nitride, and the planarization layer may be made of an organic material such as a resin.

Figure 10:
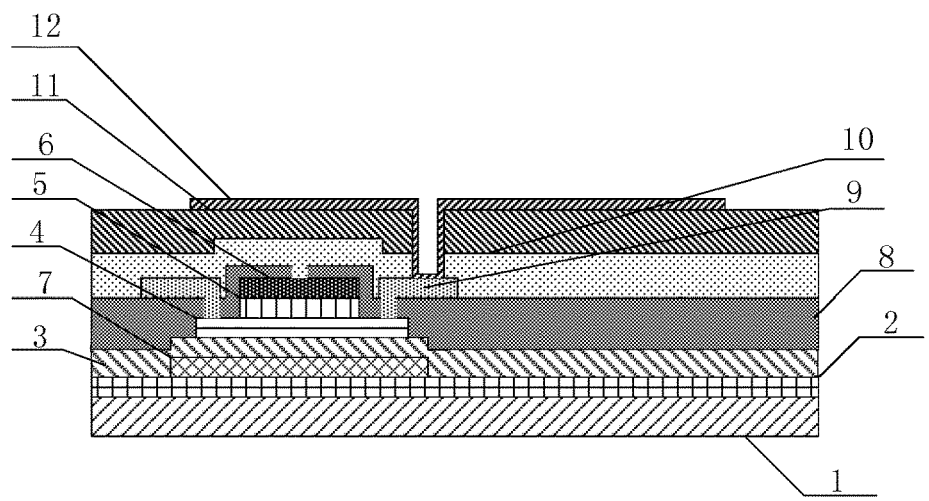
FIG. 10 is a schematic structural view illustrating fabrication of an electrode layer on the substrate of FIG. 9 according to an embodiment of the present disclosure.

Next, as shown in FIG. 10, the electrode layer 12 is formed on the planarization layer 11 by a patterning process. By way of example, the anode layer 12 may include indium tin oxide (ITO) or silver (Ag).

Figure 11:
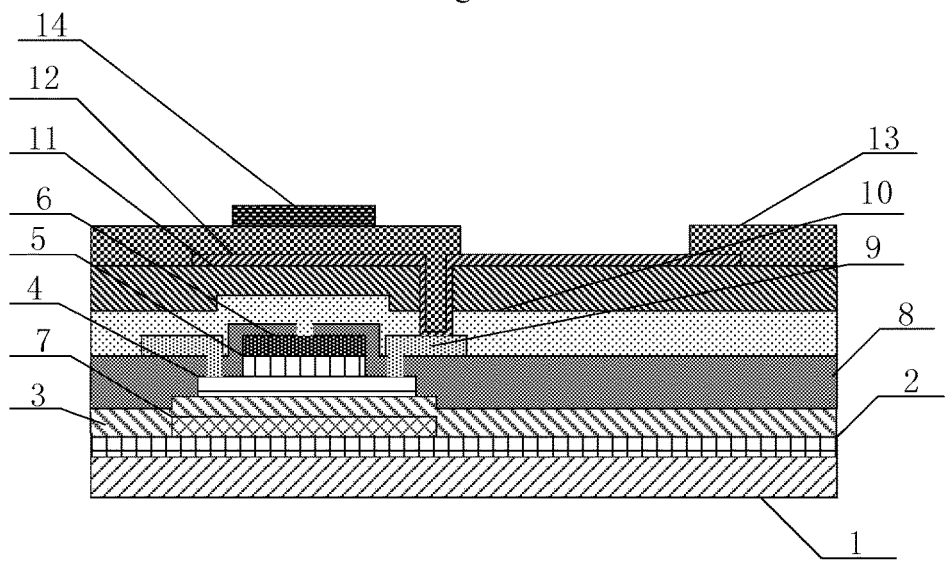
FIG. 11 is a schematic structural view illustrating fabrication of a pixel defining layer and a support layer on the substrate of FIG. 10 according to an embodiment of the present disclosure.

Next, as shown in FIG. 11, the pixel defining layer 13 and the support layer 14 are formed on the anode layer 12. Specifically, a pixel defining material layer is patterned using a patterning process and baked to form the pixel defining layer 13. A support material layer is patterned using a patterning process and baked to form the support layer 14. The support layer 14 is used to prevent an evaporation mask from directly contacting the underlying structure during the subsequent evaporation process, thereby providing protection for the underlying structure.

Next, as shown in FIG. 11, the light emitting layer 15 and the thin film encapsulation layer 16 are formed on the support layer 14.

In an embodiment of the present disclosure, instead of using a metal light shielding layer to shield high energy ultraviolet light generated in a laser lift-off process, a fluorescent layer is utilized to absorb high-energy ultraviolet light and convert it into lower-energy light. The low-energy light almost has no effect on the active layer of the transistor. Therefore, compared to the scheme in which the metal light shielding layer may cause ultraviolet light to be obliquely incident into the active layer so that a desired light shielding effect cannot be achieved, embodiments provided by the present disclosure can achieve a more desirable effect of shielding harmful light.

On the other hand, the metal light shielding layer may form a parasitic capacitance with other metal layers in the display panel, thereby affecting the performance of the display panel. In contrast, in embodiments of the present disclosure, the fluorescent layer and the metal layers in the display panel do not form a parasitic capacitance, and thus the influence of the parasitic capacitance on the characteristics of the display panel can be eliminated. In addition, in the case of a flexible display panel, the fluorescent layer can achieve a better flexible bending effect than the metal light shielding layer, and thus is more advantageous for the realization of the flexible display panel.

What have been described above are only part of the embodiments of the present disclosure. It is to be noted that those ordinarily skilled in the art can also make several improvements and modifications without departing from the principle of the present disclosure. These improvements and modifications should also be regarded as falling within the scope of the present disclosure.

The invention claimed is:
1. A display panel comprising:
  a substrate on a base;
  a transistor stack on the substrate; and
  a fluorescent layer between the base and the transistor stack,
  wherein the fluorescent layer is configured to prevent light from damaging an active layer in the transistor stack in a laser lift-off process,
  wherein an orthographic projection of the fluorescent layer on the base overlaps an orthographic projection of the active layer on the base, and
  wherein the fluorescent layer comprises a photoresist mixed with at least one of an organic fluorescent material or an inorganic fluorescent material.

2. The display panel according to claim 1, wherein the base comprises a rigid base and the substrate comprises a flexible substrate.

3. The display panel according to claim 1, wherein the orthographic projection of the fluorescent layer on the base completely overlaps the orthographic projection of the active layer on the base.

4. The display panel according to claim 1, wherein the orthographic projection of the fluorescent layer on the base completely overlaps an orthographic projection of the substrate on the base.

5. The display panel according to claim 1,
wherein the organic fluorescent material comprises at least one of fluorescein, rhodamine, a cyanine dye or a pyrene dye, and
wherein the inorganic fluorescent material comprises at least one of an alkali metal sulfide or an aluminate.

6. The display panel according to claim 1, wherein the transistor stack comprises the active layer, a gate insulating layer on the active layer, a gate on the gate insulating layer, an interlayer insulating layer on the gate, and a source and a drain on the interlayer insulating layer and in contact with the active layer through a via hole in the interlayer insulating layer.

7. The display panel according to claim 1, further comprising:
a passivation layer on the transistor stack,
a planarization layer on the passivation layer,
an electrode layer on the planarization layer and in contact with the transistor stack through a via hole in the passivation layer and the planarization layer,
a pixel defining layer on the electrode layer,
a light emitting layer on the pixel defining layer, and
a thin film encapsulation layer on the light emitting layer.

8. The display panel according to claim 7, further comprising a support layer between the pixel defining layer and the light emitting layer.

9. The display panel according to claim 1, further comprising a buffer layer between the fluorescent layer and the active layer.

10. A display device comprising the display panel according to claim 1.

11. The display device according to claim 10, wherein the base is removed from the substrate.

12. A manufacturing method of a display panel, comprising:
providing a substrate on a base;
mixing at least one of an organic fluorescent material or an inorganic fluorescent material in a photoresist to form a fluorescent material, and coating the fluorescent material on the substrate to form a fluorescent layer, the fluorescent layer being configured to prevent light from damaging an active layer in a transistor stack in a laser lift-off process;
providing the transistor stack on the fluorescent layer, wherein an orthographic projection of the fluorescent layer on the base overlaps an orthographic projection of the active layer on the base; and
lifting off the base from the substrate by the laser lift-off process.

13. The manufacturing method according to claim 12, wherein said coating the fluorescent material on the substrate to form the fluorescent layer comprises:
patterning the fluorescent material to form the fluorescent layer such that the orthographic projection of the fluorescent layer on the base completely overlaps the orthographic projection of the active layer on the base.

14. The manufacturing method according to claim 12, further comprising:
providing a buffer layer on the fluorescent layer prior to providing the transistor stack.

15. The manufacturing method according to claim 12, wherein said providing the transistor stack on the fluorescent layer comprises:
forming the active layer, a gate insulating layer, a gate, an interlayer insulating layer, and a source and a drain on the fluorescent layer successively,
wherein the source and the drain are in contact with the active layer through a via hole in the interlayer insulating layer.

16. The manufacturing method according to claim 12, further comprising:
forming a passivation layer, a planarization layer, an electrode layer, a pixel defining layer, a light emitting layer, and an encapsulation layer on the transistor stack successively,
wherein the electrode layer is in contact with a source and a drain through a via hole in the passivation layer and the planarization layer.

17. The manufacturing method according to claim 16, further comprising:
forming a support layer between the pixel defining layer and the light emitting layer.

18. The manufacturing method according to claim 12, wherein the base comprises a rigid material, and the substrate comprises a flexible material.

* * * * *